United States Patent
Sarma et al.

(10) Patent No.: US 7,442,624 B2
(45) Date of Patent: Oct. 28, 2008

(54) DEEP ALIGNMENT MARKS ON EDGE CHIPS FOR SUBSEQUENT ALIGNMENT OF OPAQUE LAYERS

(75) Inventors: Chandrasekhar Sarma, Poughkeepsie, NY (US); Ihar Kasko, Mennecy (FR)

(73) Assignee: Infineon Technologies AG, Munich (DE)

( * ) Notice: Subject to any disclaimer, the term of this patent is extended or adjusted under 35 U.S.C. 154(b) by 90 days.

(21) Appl. No.: 10/909,599

(22) Filed: Aug. 2, 2004

(65) Prior Publication Data
US 2006/0024923 A1    Feb. 2, 2006

(51) Int. Cl.
*H01L 21/46* (2006.01)
*H01L 21/78* (2006.01)
*H01L 21/301* (2006.01)
*H01L 21/76* (2006.01)
*H01L 21/311* (2006.01)

(52) U.S. Cl. .................. 438/462; 438/401; 438/694; 438/712

(58) Field of Classification Search .......... 438/462, 438/401, 975, 694, 698, 712, 637
See application file for complete search history.

(56) References Cited

U.S. PATENT DOCUMENTS

| | | | |
|---|---|---|---|
| 4,592,132 A | 6/1986 | Lee, et al. | |
| 4,657,629 A | 4/1987 | Bigelow | |
| 5,002,902 A | 3/1991 | Watanabe | |
| 5,100,834 A | 3/1992 | Mukai | |
| 5,401,691 A | 3/1995 | Caldwell | |
| 5,492,607 A | 2/1996 | Yap | |
| 5,503,962 A | 4/1996 | Caldwell | |
| 5,663,099 A | 9/1997 | Okabe, et al. | |
| 5,738,961 A | 4/1998 | Chen | |
| 5,786,260 A | 7/1998 | Jang, et al. | |
| 5,935,764 A | 8/1999 | Kakehashi | |
| 5,958,800 A | 9/1999 | Yu et al. | |
| 6,010,945 A | 1/2000 | Wu | |
| 6,043,133 A | 3/2000 | Jang et al. | |
| 6,133,111 A | 10/2000 | Sur, et al. | |

(Continued)

FOREIGN PATENT DOCUMENTS

DE    102 27 211 A 1    2/2003

OTHER PUBLICATIONS

Bajaj, R., et al., "Manufacturability Considerations and Approaches for Development of a Copper CMP Process," 1999 VMIC Conference, pp. 144-151, 1999 IMIC 109/99/0144 (c).

(Continued)

*Primary Examiner*—Chuong A. Luu
(74) *Attorney, Agent, or Firm*—Slater & Matsil, L.L.P.

(57) ABSTRACT

A method of forming alignment marks on edge chips in a kerf region of a semiconductor workpiece. The alignment marks are formed in at least one material layer of the semiconductor device. The alignment marks are formed using a separate lithography mask, and may extend into lower layers, including the workpiece, of the semiconductor device. An opaque material layer is deposited, and depressions are formed in the opaque layer over the deep alignment mark trenches. The depressions in the opaque material layer are used to align a lithography process to open the opaque material layer over alignment marks in an underlying metallization layer. The alignment marks in the metallization layer are then used to align the lithography process used to pattern the opaque material layer.

32 Claims, 7 Drawing Sheets

U.S. PATENT DOCUMENTS

| | | | |
|---|---|---|---|
| 6,146,969 | A | 11/2000 | Tan, et al. |
| 6,174,737 | B1 | 1/2001 | Durlam, et al. |
| 6,183,614 | B1 | 2/2001 | Fu |
| 6,284,551 | B1 | 9/2001 | Cho et al. |
| 6,319,767 | B1 | 11/2001 | Cha et al. |
| 6,342,735 | B1 | 1/2002 | Colelli et al. |
| 6,346,454 | B1 | 2/2002 | Sung, et al. |
| 6,380,049 | B1 * | 4/2002 | Hamada et al. .............. 438/462 |
| 6,420,261 | B2 | 7/2002 | Kudo |
| 6,447,634 | B1 | 9/2002 | Zahorik, et al. |
| 6,519,036 | B1 * | 2/2003 | Hickman .................... 356/399 |
| 6,555,925 | B1 | 4/2003 | Higashi et al. |
| 6,566,157 | B2 | 5/2003 | Ohtaka |
| 6,774,452 | B1 | 8/2004 | Ramkumar et al. |
| 6,780,775 | B2 | 8/2004 | Ning |
| 6,858,441 | B2 | 2/2005 | Nuetzel et al. |
| 6,979,526 | B2 | 12/2005 | Ning |
| 7,223,612 | B2 | 5/2007 | Sarma |
| 2001/0001077 | A1 | 5/2001 | Tan et al. |
| 2001/0001571 | A1 | 5/2001 | Johnson et al. |
| 2001/0001735 | A1 | 5/2001 | Chu et al. |
| 2001/0040778 | A1 | 11/2001 | Abraham, et al. |
| 2002/0009876 | A1 | 1/2002 | Wege, et al. |
| 2002/0072195 | A1 | 6/2002 | Anma et al. |
| 2002/0096775 | A1 | 7/2002 | Ning |
| 2002/0098705 | A1 | 7/2002 | Low |
| 2002/0098707 | A1 | 7/2002 | Ning |
| 2002/0100978 | A1 | 8/2002 | Tomita, et al. |
| 2002/0153551 | A1 | 10/2002 | Wong, et al. |
| 2002/0192926 | A1 | 12/2002 | Schroeder et al. |
| 2003/0017707 | A1 | 1/2003 | Yamashita, et al. |
| 2003/0102576 | A1 | 6/2003 | Teramoto |
| 2003/0224260 | A1 | 12/2003 | Ning |
| 2004/0038543 | A1 | 2/2004 | Zahorik et al. |
| 2004/0043579 | A1 | 3/2004 | Nuetzel, et al. |
| 2004/0102014 | A1 | 5/2004 | Ning et al. |
| 2005/0079683 | A1 | 4/2005 | Sarma, et al. |
| 2006/0017180 | A1 * | 1/2006 | Sarma ........................ 257/797 |
| 2006/0141737 | A1 | 6/2006 | Galdis |

OTHER PUBLICATIONS

Raghavan, S., et al. "Electrochemical Behavior of Copper and Tantalum in Silica Slurries Containing Hydroxylamine," 1999 VMIC Conference, pp. 619-626, 1999 IMIC 109/99/0619 (c).

Wang, C.T., et al., "Pad Wear Analysis in CMP," 1999 VMIC Conference, pp. 267-269, 1999 VMIC 109/99/0267 (c).

Wong, K.K.H., et al., "Metallization by Plating for High-Performance Multichip Modules," IBM J. Res. Develop., Sep. 1998, pp. 587-596, vol. 42, No. 5.

* cited by examiner

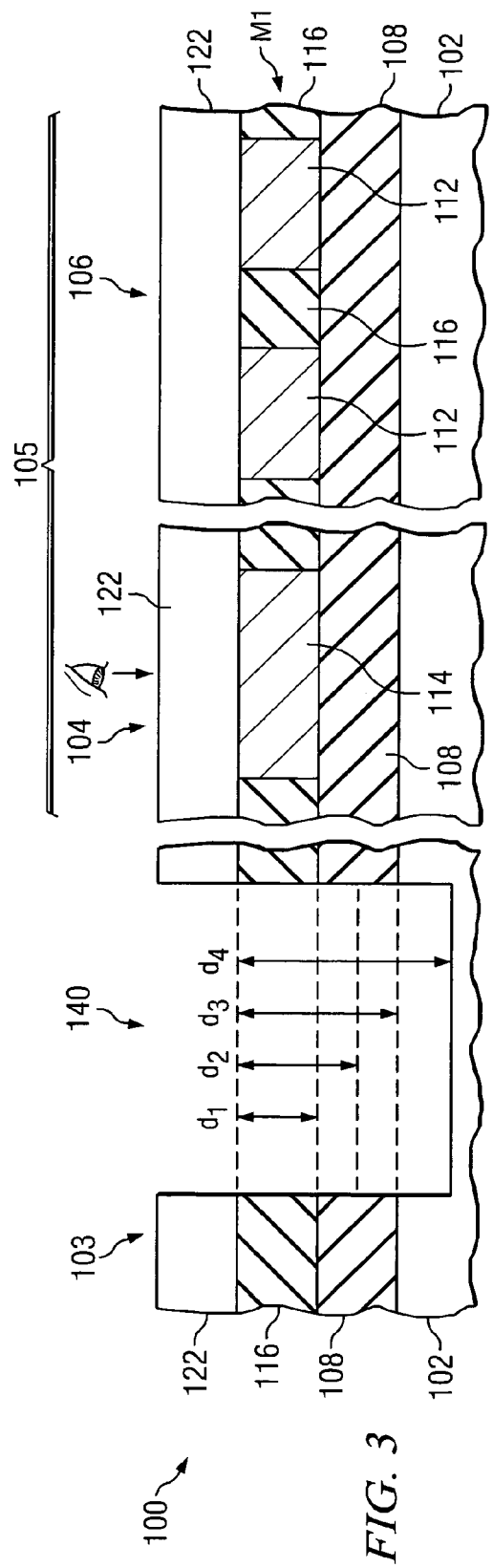
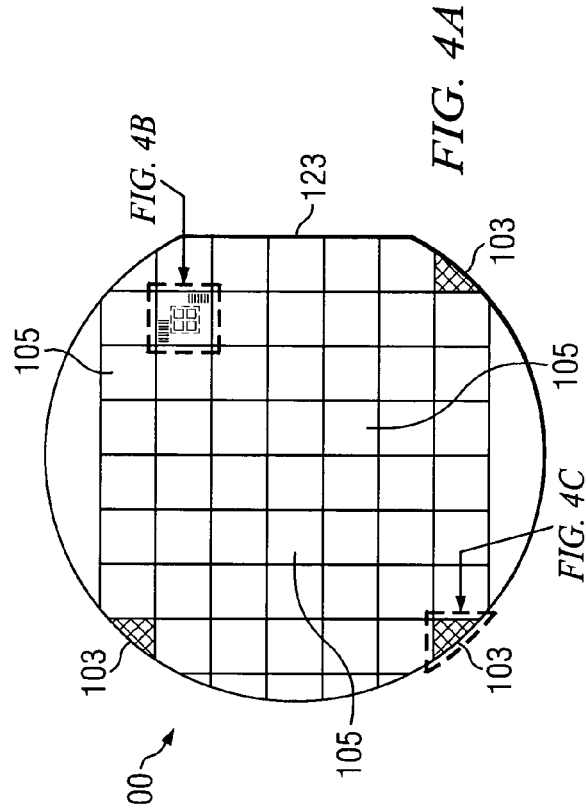

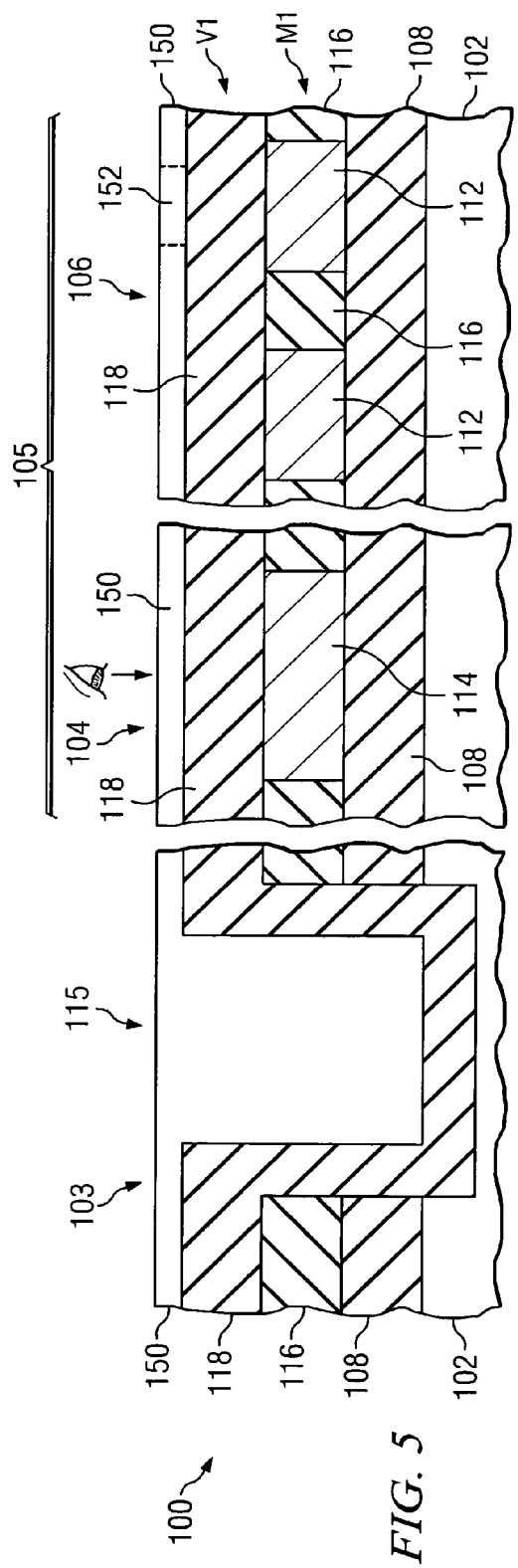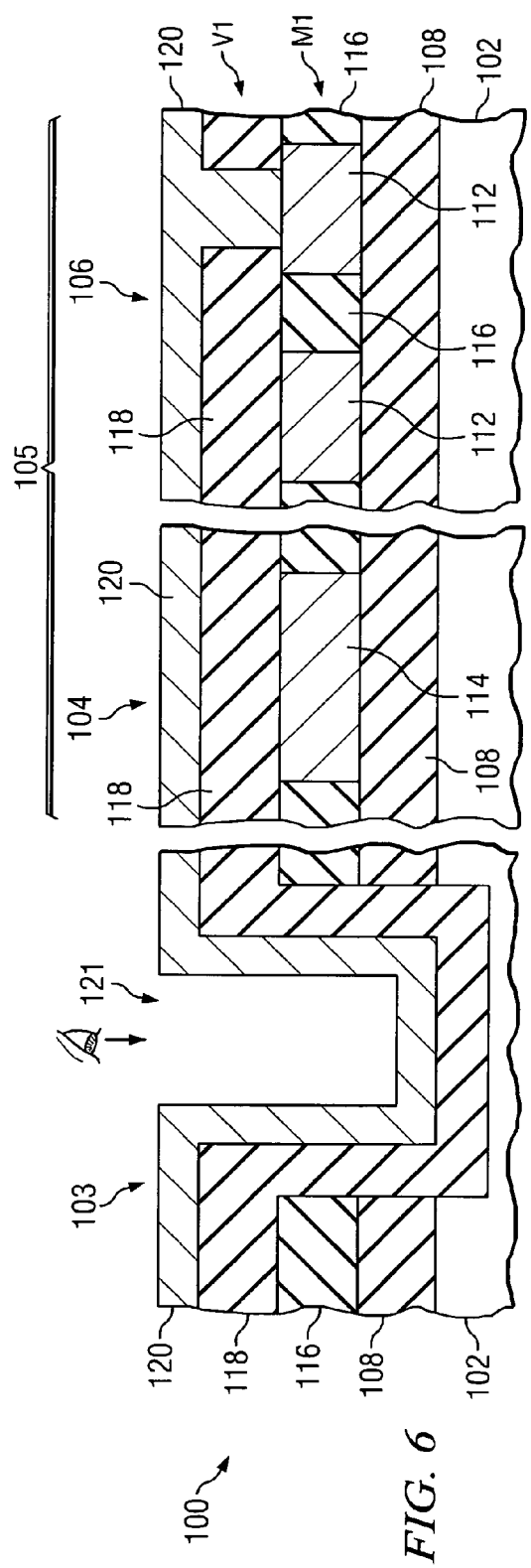

DEEP ALIGNMENT MARKS ON EDGE CHIPS FOR SUBSEQUENT ALIGNMENT OF OPAQUE LAYERS

CROSS-REFERENCE TO RELATED APPLICATIONS

This application relates to the following and commonly assigned patent application: Ser. No. 10/899,253 filed on Jul. 26, 2004, now U.S. Pat. No. 7,223,612 entitled, "Alignment of MTJ Stack to Conductive Lines in the Absence of Topography," which application is hereby incorporated herein by reference.

TECHNICAL FIELD

The present invention relates generally to the fabrication of semiconductor devices, and more particularly to the alignment of opaque material layers of semiconductor devices.

BACKGROUND

Generally, semiconductor devices are fabricated by deposited a plurality of insulating, conductive and semiconductive material layers over a substrate or workpiece, and patterning the various material layers to form integrated circuits and electronic elements thereon. Each layer is typically aligned to an underlying material layer using alignment marks. The tools used to fabricate semiconductor devices visually locate the alignment marks, the position of which are programmed into the tools.

If a material layer is transparent or translucent, as many insulating material layers and semiconductive material layers are, as well as photoresists or hard masks that are used as masks to pattern material layers, the tool can "see through" the insulating layer, semiconductor material layer or photoresist and locate the alignment marks. However, many conductive layers are optically opaque, and thus additional steps must be taken to align them.

One way to align optically opaque layers is to form recessed alignment marks in an underlying material layer, by forming them simultaneously while conductive lines or vias are formed in a damascene process, removing a portion of the material from the alignment marks, and depositing the opaque layer over the material layer with recessed alignment marks. In theory, the alignment marks would then be visible on the top surface of the opaque layer, e.g., as depressions.

However, if the recessed alignment marks are formed in a damascene formed layer, such as conductive lines or vias formed in an insulating layer, and the insulating layer is subjected to a chemical mechanical polish (CMP) process, (as is typical to remove excess conductive material from the top surface of the insulating layer to form the conductive lines or vias) the edges of the alignment marks become eroded by the CMP process, and thus the edges are not sharp. This makes it difficult to use the alignment marks to align a subsequently deposited opaque layer, because the depressions transferred to the topography of the opaque layer are not as visible on the top surface of the opaque layer. The presence of clearly defined alignment marks is required for extremely tight alignment tolerance, as dictated by device performance.

There are other problems with using a CMP process over recessed alignment marks. Debris from the CMP slurry can become trapped in the alignment marks, making the topography of a subsequently deposited layer less visible, or not visible at all, particularly if the alignment marks are shallow. In addition, the deposition of opaque layers over such alignment marks give rise to jagged edges in the depressions in the topography of the opaque layer over the alignment marks, making the depressions unusable for alignment. Furthermore, the CMP slurry materials left in the alignment marks can react with some materials used in subsequent etch processes, such as chlorine or fluorine, causing the alignment marks to explode, making them unusable as alignment marks. This creates foreign materials all over the chip, leads to delamination of layers, and thus adversely affects the device performance and reduces yield.

A recent development in semiconductor memory devices are referred to as resistive memory devices, such as magnetic random access memory (MRAM) devices. In MRAM devices, the spin of electrons, rather than the charge, is used to indicate the presence of a "1" or "0." MRAM devices comprise conductive lines (wordlines and bitlines) positioned in a different direction, e.g., perpendicular to one another in different metal layers, the conductive lines sandwiching a resistive memory element comprising a magnetic stack or magnetic tunnel junction (MTJ), which functions as a magnetic memory cell. A current flowing through one of the conductive lines generates a magnetic field around the conductive line and orients the magnetic polarity into a certain direction along the wire or conductive line. A current flowing through the other conductive line induces the magnetic field and can partially turn the magnetic polarity, also. Digital information, represented as a "0" or "1," is storable in the alignment of magnetic moments. The resistance of the magnetic memory cell depends on the moment's alignment. The stored state is read from the magnetic memory cell by detecting the component's resistive state.

The MTJ's of MRAM devices typically comprise a first magnetic layer, a tunnel insulator formed over the first magnetic layer, and a second magnetic layer formed over the tunnel insulator. The first magnetic layer and the second magnetic layer each typically comprise one or more layers of magnetic materials and/or metal materials, for example. The first magnetic layer may comprise a seed layer of Ta and/or TaN, an antiferromagnetic layer such as PtMn disposed over the seed layer, and one or more magnetic material layers comprising CoFe, NiFe, CoFeB, Ru, other materials, or combinations thereof disposed over the antiferromagnetic layer, as examples. The first magnetic layer is also referred to as a fixed layer because its magnetic polarity is fixed. The second magnetic layer may comprise one or more magnetic material layers comprising CoFe, NiFe, CoFeB, other magnetic material layers, or combinations thereof, as examples. The second magnetic layer is also referred to as a free layer because its magnetic polarity changes when the magnetic memory cell is written to. The tunnel insulator may comprise a thin insulator such as $Al_2O_3$ or semiconductive materials, as examples.

Copper is often used for the material of conductive lines of MRAM devices, because of its high conductivity and low resistance. However, copper is difficult to etch, and damascene processes using CMP processes are often used to form copper lines and metallization alignment marks in conductive line and via levels. Furthermore, because the first magnetic layer and second magnetic layer of MTJ's comprise metals, they are opaque.

What is needed in the art are improved methods of aligning the opaque magnetic stacks or MTJ's of MRAM devices to underlying material layers that may be formed by CMP, such as the wordlines, bitlines, or conductive via levels of the MRAM array.

SUMMARY OF THE INVENTION

These and other problems are generally solved or circumvented, and technical advantages are generally achieved, by preferred embodiments of the present invention, which provide methods of forming deep alignment marks in edge regions of a workpiece in an underlying material layer, before depositing an opaque material. The deep alignment marks preferably extend into one or more insulating layers. The deep alignment marks are formed in the edge or kerf regions of the workpiece in areas of the workpiece that are unused, e.g., where incomplete chips are formed due to the shape of the workpiece being round, for example. The deep alignment marks are formed at least in a via layer inter-level dielectric (ILD) layer disposed over a metallization layer of a semiconductor device. The deep alignment marks may extend into the ILD layer of the underlying metallization layer, and further into underlying material layers or workpiece. The deep alignment marks are formed using a separate lithography mask, and preferably are formed at least as deep as vias are formed in the via layer in one embodiment. The separate lithography mask for the novel deep alignment marks only includes alignment marks in the kerf of each chip or die. The deep alignment marks are not part of the finished product, as the incomplete chips they are formed on are discarded along with other incomplete chips of the workpiece after the die singulation process.

In accordance with a preferred embodiment of the present invention, a method of manufacturing a semiconductor device includes providing a workpiece, the workpiece including a plurality of die regions and a kerf region, each die region including an alignment mark region and a component region. A first insulating layer is formed over the workpiece, at least one first alignment mark is formed over the alignment mark region of each die region, and a plurality of first conductive lines is formed over the component region of each die region within the first insulating layer. Forming the at least one first alignment mark comprises filling the at least one first alignment mark with a conductive material. At least one second alignment mark is formed within at least the first insulating layer over the kerf region of the workpiece, the at least one second alignment mark comprising a trench having a bottom and sidewalls. An opaque material layer is deposited over the at least one second alignment mark and the first insulating layer, the opaque material layer lining the bottom and sidewalls of the trench of the at least one second alignment mark, leaving a depression in the opaque material layer over each at least one second alignment mark. The method includes depositing a first masking layer over the opaque material layer, and patterning the first masking layer using a lithography mask or tool, removing the first masking layer from over the at least one first alignment mark, and using the depression over the at least one second alignment mark to align the lithography mask or tool used to pattern the first masking layer over the opaque material layer. The opaque material layer is removed from over the at least one first alignment mark using the first masking layer as a mask, and the first masking layer is removed. A second masking layer is deposited over the opaque material layer and the at least one first alignment mark, and the second masking layer is patterned with a pattern for the opaque material layer in the component region of each die region using the at least one first alignment mark for alignment. The opaque material layer is then patterned using the second masking layer as a mask.

In accordance with another preferred embodiment of the present invention, a method of manufacturing a magnetic memory device includes providing a workpiece, the workpiece including a plurality of die regions and a kerf region, each die region comprising an alignment mark region at the edges thereof and an array region disposed within the alignment mark region. A first insulating layer is formed over the workpiece, and at least one first alignment mark is formed over the alignment mark region of each die region and a plurality of first conductive lines are formed over the array region of each die region within the first insulating layer, wherein forming the at least one first alignment mark comprises filling the at least one first alignment mark with a conductive material. At least one second alignment mark is formed within at least the first insulating layer over the kerf region of the workpiece, the at least one second alignment mark comprising a trench having a bottom and sidewalls. A second insulating layer is formed over the at least one second alignment mark, the at least one first alignment mark, the plurality of first conductive lines, and the first insulating layer. The second insulating layer lines the bottom and sidewalls of the at least one second alignment mark trench. A conductive via is formed in the second insulating layer over the array region of each die region using a damascene process, wherein the conductive via material lines the second insulating layer lining the at least one second alignment mark bottom and sidewalls. A first magnetic stack is formed over conductive via and the second insulating layer, forming a depression in the first magnetic stack over each at least one second alignment mark. A first masking layer is deposited over the first magnetic stack, the first masking layer is patterned using a lithography mask or tool, and the first masking layer is removed from over the at least one first alignment mark, using the depression in the first magnetic stack over the at least one second alignment mark to align the lithography mask or tool used to pattern the first masking layer over the first magnetic stack. The first magnetic stack is removed from over the at least one first alignment mark using the first masking layer as a mask, leaving the at least one alignment mark exposed, and the first masking layer is removed. A second masking layer is deposited over the first magnetic stack and the at least one first alignment mark, and the second masking layer is patterned with a pattern for the first magnetic stack in the array region of each die region using the at least one first alignment mark for alignment. The first magnetic stack is patterned using the second masking layer as a mask, wherein the patterned first magnetic stack comprises a magnetic memory cell.

In accordance with another preferred embodiment of the present invention, a method of forming alignment marks of a semiconductor workpiece includes providing a semiconductor workpiece, the workpiece including a plurality of die regions and at least one kerf region. The at least one kerf region comprises regions where die is not formed or where incomplete die is formed. The workpiece includes at least one material layer disposed thereon. The method includes forming a first set of alignment marks in a first kerf region, and forming a second set of alignment marks in a second kerf region, wherein the first set of alignment marks and the second set of alignment marks extend at least about 8,000 Angstroms into the at least one material layer disposed on the workpiece, or into the at least one material layer and the workpiece.

In accordance with yet another preferred embodiment of the present invention, a semiconductor workpiece includes a plurality of die regions and at least one kerf region, the at least one kerf region comprising regions where die is not formed or where incomplete die is formed. The workpiece includes at least one material layer disposed thereon. The workpiece includes a first set of alignment marks in a first kerf region, and a second set of alignment marks in a second kerf region.

The first set of alignment marks and the second set of alignment marks extend at least about 8,000 Angstroms into the at least one material layer disposed on the workpiece, or into the at least one material layer and the workpiece.

Advantages of embodiments of the present invention include providing improved methods of patterning opaque material layers of semiconductor devices. Because the deep alignment marks formed in the via level insulating layer are not subjected to a CMP process and are relatively deep, e.g., about 8,000 Angstroms or more, and about 1 μm or more in one embodiment, the depressions formed in the opaque material layer are clearly visible and advantageously, can be used for alignment in the lithography process to expose alignment marks in an underlying metallization layer. The exposed alignment marks in the metallization layer may then be used to align the lithography process to pattern the opaque material layer. The deep alignment marks are formed in unused areas or areas of incomplete die on the workpiece kerf region, making use of wasted space on the workpiece and providing improved alignment. The kerf region portions of the workpiece may simply be discarded after the singulation process to separate the individual die. Embodiments of the present invention are particularly beneficial when used with semiconductor devices having a top surface with no topography, or very little topography (e.g., having shallow features or alignment marks).

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1 through 3 show cross-sectional views of an MRAM device at various stages of manufacturing in accordance with a preferred embodiment of the present invention;

FIG. 4A shows a top view of a semiconductor wafer or workpiece having die regions and kerf regions disposed thereon;

FIGS. 5 through 12 show cross-sectional views of an MRAM device at various stages of manufacturing in accordance with a preferred embodiment of the present invention.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely an MRAM device. The invention may also be applied, however, to other resistive memory devices or semiconductor devices with opaque material layers.

Figure 1:
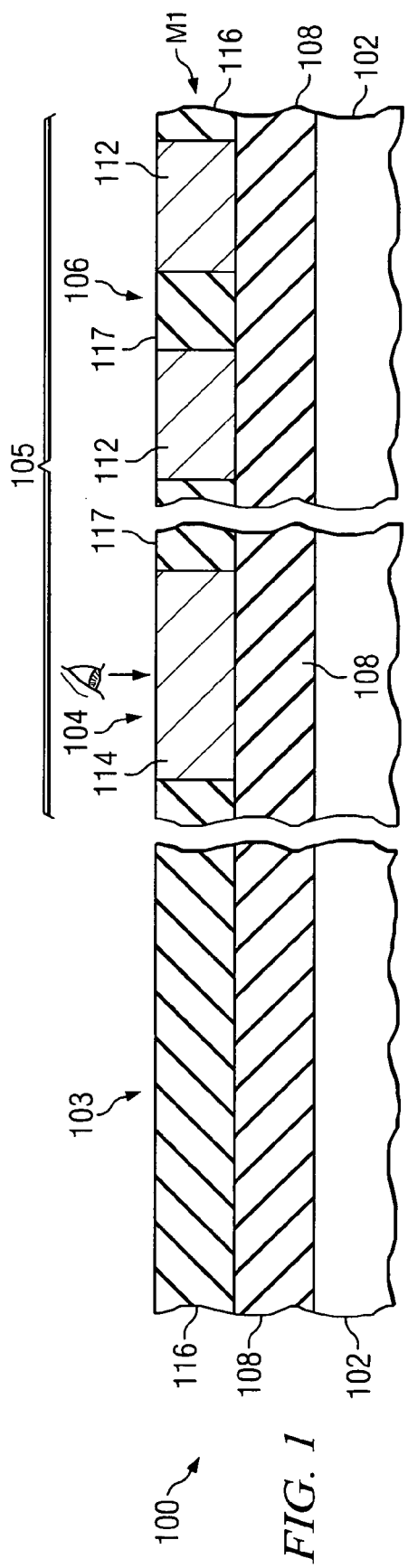

Embodiments of the present invention provide novel methods of forming deep alignment marks in kerf regions of a workpiece, and using the deep alignment marks for alignment when opening up areas of other alignment marks, e.g., in a metallization layer, so that the other alignment marks can be used to pattern opaque material layers and align to features within the metallization layer. With reference now to FIG. 1, there is shown a cross-sectional view of a semiconductor device 100 comprising a workpiece 102. The workpiece 102 may include a semiconductor substrate comprising silicon or other semiconductor materials covered by one or more optional insulating layers such as insulating layer 108, for example, to be described further herein. The insulating layer 108 may comprise an oxide, a nitride, low dielectric constant materials, or other insulating material layers, as examples. The workpiece 102 may also include other active components or circuits formed in a front end of line (FEOL), not shown. The workpiece 102 may comprise silicon oxide over single-crystal silicon, for example. The workpiece 102 may include other conductive layers or other semiconductor elements, e.g. transistors, diodes, etc. Compound semiconductors, GaAs, InP, Si/Ge, or SiC, as examples, may be used in place of silicon. For example, the workpiece 102 may include component regions or various circuit elements formed therein.

Figure 4B:
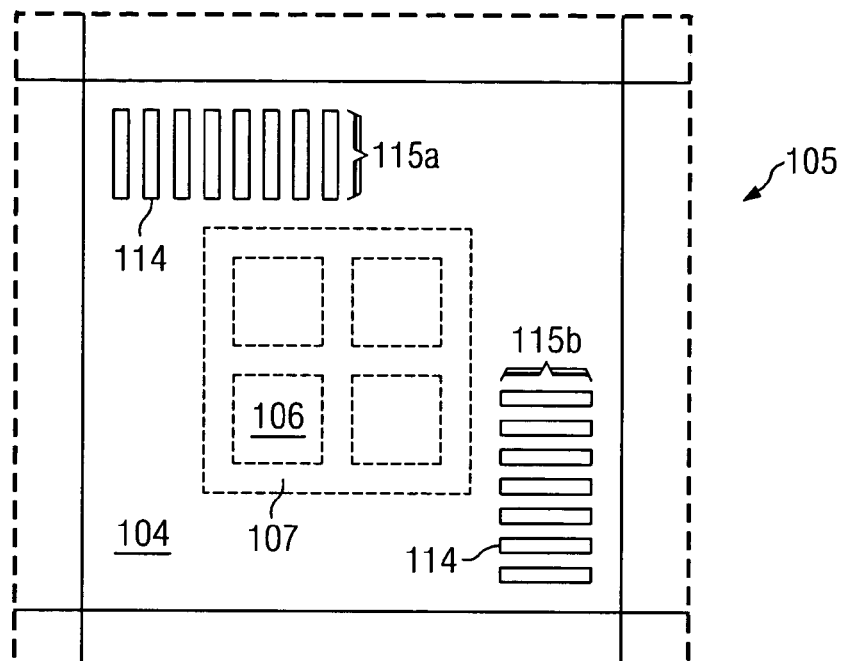
FIG. 4B shows a more detailed view of a die region of the workpiece shown in FIG. 4A, illustrating the locations of the alignment mark region and the array regions of an MRAM device.
Figure 4C:
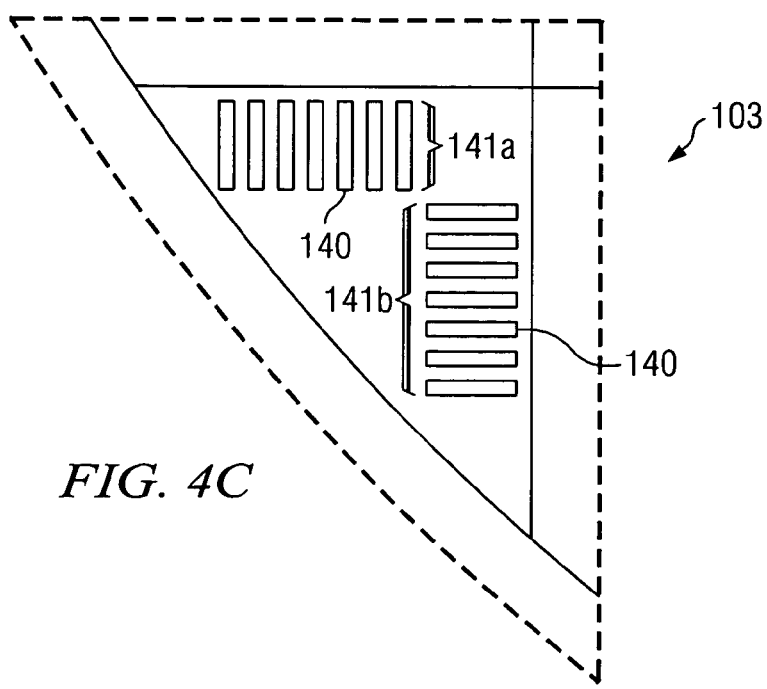
FIG. 4C shows a more detailed view of a kerf region of the workpiece shown in FIG. 4A, comprising an incomplete chip.

The workpiece 102 includes a plurality of kerf regions 103 and a plurality of die regions 105, as shown in a cross-sectional view in FIG. 1 and in top views in FIGS. 4A, 4B, and 4C. Only one kerf region 103 and one die region 105 is shown in the cross-sectional views in FIGS. 1-3 and 5-12. Each die region 105 includes an alignment mark region 104 disposed at the edges thereof, and an array region 106 disposed within the alignment mark region 104, as shown in FIGS. 1 and 4B. The workpiece 102 includes a plurality of individual semiconductor devices or die regions 105 which are separated or singulated after the manufacturing process is completed to form individual die, which may then be packaged separately or together with other die, for example. Each die region 105 may comprise an MRAM device 105, although alternatively, each die region 105 may comprise other types of semiconductor devices, for example.

The kerf or edge regions 103 comprise unused areas of the workpiece 102, mostly at the edge of the workpiece 102, in one embodiment, which may comprise a substantially square or rectangular shape, substantially the same size as a die region 105 on at least two edges, for example. Some kerf regions 103 have a curved edge due to the substantially circular shape of the semiconductor workpiece 100, as shown in FIGS. 4A and 4C. If an integrated circuit were to be patterned on these kerf regions 103, an incomplete die or chip would be formed or patterned (because of the absence of the semiconductor workpiece 102 at the curve.) Thus, some kerf regions 103 comprise incomplete die. The kerf regions 103 may be patterned using the same lithography process as the die regions 105, or alternatively, the lithography tools such as steppers may be programmed to not pattern some of the kerf regions 103, and thus, these kerf regions 103 comprise unused space or surface area of the workpiece 100. Some of the kerf regions 103 may alternatively comprise the same size as a die region 105 on all edges (not shown).

On a single MRAM device 105, shown in a top view in FIG. 4B, there may be a plurality of array regions 106. For example, four array regions 106 are shown; however, there may be 32 array regions 106 on a single die 100 (although there may be other numbers of array regions 106, depending on the size of the magnetic memory device). The workpiece 102 may also include other regions, such as a peripheral support circuitry region 107 and/or other regions, for example.

Referring again to FIG. 1, a metallization layer M1 will be formed in a first insulating layer 116, as shown, over the workpiece 102, in accordance with a preferred embodiment of the invention. Alignment marks 114 are formed in the same metallization layer M1. For optimal alignment to the conductive lines 112 formed in the metallization layer M1, preferably subsequently deposited material layers should be aligned using the alignment marks 114 in the metallization layer M1. Embodiments of the present invention provide methods of obtaining access to the alignment marks 114 for alignment of subsequently deposited material layers, such as opaque materials.

A via layer V1 will later be formed in a second insulating layer 118, in one embodiment. Preferably, and optionally, before the metallization layer M1 is formed, at least one third insulating layer 108 is formed over the workpiece 102, as shown. The third insulating layer 108 preferably comprises silicon dioxide and may alternatively comprise low dielectric constant materials, other insulating materials, or combinations or multiple layers thereof, as examples. The third insulating layer 108 may alternatively comprise other materials, for example. The third insulating layer 108 may comprise a thickness of a few thousand Angstroms, e.g., 3000 Angstroms or less, as examples, although alternatively, the third insulating layer 108 may comprise other thicknesses. The third insulating layer 108 may alternatively comprise a plurality of insulating layers 108 (not shown).

A first insulating layer 116 (the insulating layer for the metallization layer M1) is deposited over the at least one third insulating layer 108, as shown. The first insulating layer 116 preferably comprises silicon dioxide and may alternatively comprise low dielectric constant materials, other insulating materials, or combinations or multiple layers thereof, as examples. The first insulating layer 116 may alternatively comprise other materials, for example. The first insulating layer 116 may comprise a thickness of a few thousand Angstroms, e.g., 3,000 Angstroms or less, as examples, although alternatively, the first insulating layer 116 may comprise other thicknesses.

A plurality of first conductive lines 112 is formed within the first insulating layer 116 in the array region 106. The first conductive lines 112 may include an optional conductive liner (not shown), and a conductive material disposed over and filling the liner, for example. Alternatively, the first conductive lines 112 may comprise a single material, or two or more materials, for example. The conductive material may comprise copper, aluminum, or combinations thereof, as examples, although alternatively, the conductive material may comprise other conductive materials. The first conductive lines 112 may be formed in a damascene process, for example. Alternatively, the first conductive lines 112 may be formed using a subtractive etch process, for example. The first conductive lines 112 function as wordlines or bitlines of an MRAM device 105, for example, and are used to access each MTJ 124 (not shown in FIG. 1; see FIG. 11 at 124).

At least one first alignment mark 114 is formed in the first insulating layer 116 in the alignment mark region 104, as shown. The first alignment marks 114 preferably comprise the same material as the first conductive lines 112, e.g., and preferably comprise a conductive material. The first alignment marks 114 preferably comprise the same depth within the first insulating layer 116 as the first conductive lines 112, as shown, or alternatively, the first alignment marks 114 may comprise a depth within the first insulating layer 116 that is less than the depth of the first conductive lines 112 within the first insulating layer 116. The first alignment marks 114 are preferably formed using the same photolithography mask and during the same etch process that the first conductive lines 112 are formed in, for example. The first alignment marks 114 comprise alignment marks for a metallization layer (e.g., M1 or other metallization level) of the device 105, for example. The first alignment marks 114 may comprise one or more sets of alignment marks, for example (although only one first alignment mark 114 is shown in the figures).

The first alignment marks 114 and first conductive lines 112 are preferably formed simultaneously in a single damascene process. For example, the patterns for the alignment marks 114 and the first conductive lines 112 are formed in the first insulating layer 116, and a conductive material is deposited over the patterns to fill the patterns. Excess conductive material is removed from over the top surface of the first insulating layer 116, forming the alignment marks 114 and the first conductive lines 112 and leaving a planar top surface.

Figure 2:
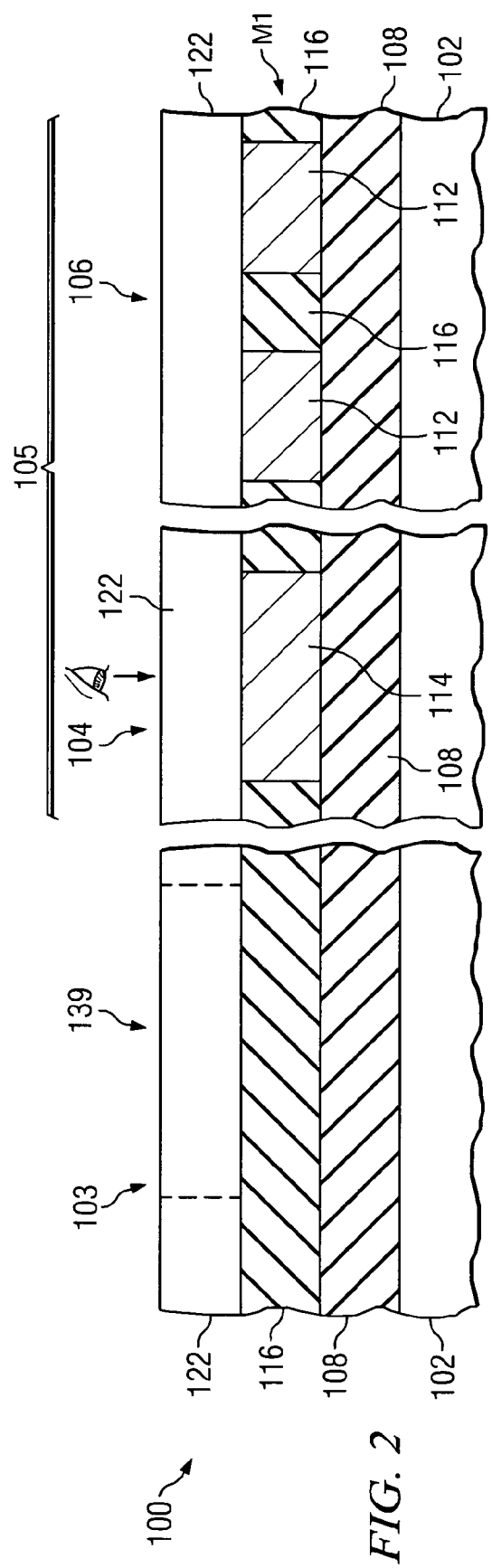

In accordance with a preferred embodiment of the present invention, next, a novel at least one deep alignment mark 140 is formed in the kerf region 103 of the workpiece 100, as shown in FIGS. 2 and 3. The at least one deep alignment mark 140 is also referred to herein as a "second alignment mark," "at least one second alignment mark," or a "deep alignment mark," and these terms are used interchangeably, for example.

To form the at least one deep alignment mark 140, a mask 122 is deposited over the top surface 117 of the first insulating layer 116 as shown in FIG. 2, and the mask 122 is patterned with the desired alignment mark pattern 139, as shown in phantom in FIG. 2. The mask 122 may comprise a photoresist, a hard mask and a photoresist, or another material and a photoresist, as examples, although alternatively, the mask 122 may comprise other materials.

The mask 122 may be patterned using a lithography mask, or may be directly patterned using electron beam lithography (EBL) or other direct patterning method, as examples. The mask 122 is used to mask portions of the first insulating layer 116 (e.g., die regions 105) while at least the first insulating layer 116 is patterned, e.g., using an etch process, with the at least one deep alignment mark 140, as shown in FIG. 3. The at least one deep alignment mark 140 may comprise a plurality of deep alignment marks 140 in a preferred embodiment (not shown in FIG. 3; see FIG. 4C, to be described further herein).

The alignment marks 140 are relatively deep. For example, in one embodiment, the at least one deep alignment mark 140 extends through the entire thickness of the first insulating layer 116, as shown in phantom at $d_1$. For example, if the first insulating layer 116 comprises a thickness of about 1,500 Angstroms, then in this embodiment, the deep alignment mark 140 comprises a depth of about 1,500 Angstroms.

In yet another embodiment, the deep alignment mark 140 extends through the entire thickness of the first insulating layer 116 and also through a portion of the optional at least one third insulating layer 108, as shown in phantom at $d_2$. Depth $d_2$ of the deep alignment mark 140 preferably comprises at least about 2,000 Angstroms in this embodiment.

In another embodiment, the at least one deep alignment mark 140 extends through the entire thickness of the first insulating layer 116 and also through the entire thickness of one or more third insulating layer 108, as shown in phantom at $d_3$. Depth $d_3$ of the deep alignment mark 140 preferably comprises at least about 4,500 Angstroms in this embodiment.

In yet another embodiment, the at least one deep alignment mark 140 extends through the entire thicknesses of both the first insulating layer 116, the at least one third insulating layer 108, and also into a top portion of the workpiece 102, as shown in phantom at $d_4$. Depth $d_4$ of the deep alignment mark 140 preferably comprises at least about 8,000 Angstroms in one embodiment. In another embodiment, the depth $d_4$ of the deep alignment mark 140 preferably comprises at least about 1 µm, for example, although the deep alignment mark 140 may alternatively comprise other dimensions. In yet another embodiment, the depth $d_4$ of the deep alignment mark 140 comprises about 3 µm or less, for example.

In one embodiment, the depth of the alignment mark preferably comprises the thickness of the second insulating layer 118 (not shown in FIG. 3; see FIG. 7) and the via conductive material 120 plus an additional amount sufficient to ensure that a deep enough trench or depression 121 is formed that will be detectable by lithography equipment, after a CMP process to remove excess via conductive material 120 from a top surface of the second insulating layer 118.

Referring again to FIG. 3, after the deep alignment mark 140 is formed in at least the first insulating layer 116, the mask 122 is then removed. The materials 112, 114 and 116 are substantially planar, with the exception of the deep alignment mark 140 formed in the kerf region 103, at this stage of the manufacturing process. The deep alignment mark 140 preferably comprises a trench having sidewalls and a bottom surface, as shown. The deep alignment mark 140 trench is preferably devoid of any materials.

Preferably, in one embodiment, in order to etch or form the deep alignment mark 140 within the first insulating layer 116, the deep alignment marks 140 are not formed over conductive material within the metallization layer M1. Otherwise, the conductive material would prevent the etching or formation of the deep alignment mark 140 within at least the first insulating layer 116, in one embodiment, for example.

Although only one deep alignment mark 140 is shown in the figures, preferably, at least one alignment mark 140 is formed. For example, a plurality of deep alignment marks 140 may be formed in a pattern in a kerf region 103 of the workpiece 100. For example, one or more sets of deep alignment marks 140 may be formed, in accordance with an embodiment of the present invention. Preferably, at least two sets of deep alignment marks 140 are formed in two ore more kerf regions 103 of the workpiece 100, to be described further herein with reference to the top views shown in FIGS. 4A, 4B, and 4C.

FIG. 4A shows a top view of a workpiece 100 comprising a plurality of die regions 105 formed thereon and a plurality of kerf or edge regions 103 that may be unused or may have incomplete die formed on them. The workpiece may have at least one flat edge 123 that is used for mechanical alignment within a chuck, for example (although first alignment marks 114 or other underlying alignment marks, not shown, may also be used for more exact alignment within a chuck or tool such as a stepper, for example). For an MRAM device 105, there may be 60 or more individual die regions or devices 105 formed on a single workpiece, as an example, although other numbers of die regions 105 may be formed, for example.

FIG. 4B shows a more detailed view of a die region 105 shown in FIG. 4A. The alignment mark region 104 is typically located in the edge region of the die region 105. The width of the alignment mark region 104 at the die edge may comprise about 200 µm, as an example, although the alignment mark region 104 may alternatively comprise other dimensions. A first set 115a and a second set 115b of first alignment marks 114 may be formed in the alignment mark region 104 in a metallization layer M1 (see FIG. 3), as shown. Each set 115a and 115b may comprise about 10 or more first alignment marks 114, in one embodiment. For example, a set 115a or 115b may comprise 11, 13 or other number of first alignment marks 114.

FIG. 4C shows a more detailed view of a kerf region 103 shown in FIG. 4A. Preferably, in one embodiment, a first set 141a and a second set 141b of deep alignment marks 140 are formed in the kerf region 103, as shown. Each set 141a and 141b may comprise about 10 or more deep alignment marks 140, in one embodiment. For example, a set 141a or 141b may comprise 11, 13 or other number of deep alignment marks 140. Each deep alignment mark 140 preferably comprises a width of about 2 µm or less and a length of about 60 µm or less, although alternatively, the deep alignment marks 140 may comprise other dimensions.

Preferably, one set 141a is formed along the top or bottom of a kerf region 103, and the other set 141b is formed along the left edge or right edge of the kerf region 103. For example, one set 141a may be formed at a top edge of the kerf region 103, as shown. Alternatively, set 141a may be formed at the bottom edge of the kerf region 103 (not shown). Similarly, set 141b may be formed along the right side edge of the kerf region 103, as shown, or alternatively, set 141b may be formed along the left side edge of the kerf region 103 (not shown). The top or bottom edge set 141a of alignment marks 140 is preferably arranged with the long side of the alignment marks 140 positioned vertically, and the side edge set 141b of alignment marks 140 is preferably arranged with the long side of the alignment marks 140, positioned horizontally, as shown. The number and arrangement of the deep alignment marks 140 and the number of sets 141a and 141b according to embodiments of the present invention is a function of the particular lithography equipment and tools used to manufacture the semiconductor device 100, for example.

The sets 141a and 141b of deep alignment marks 140 may be formed in any number of kerf regions 103 of the workpiece 100. For example, to achieve alignment, the novel deep alignment marks 140 are preferably formed in at least two kerf regions 103. However, to achieve improved alignment, the deep alignment marks 140 are preferably formed in at least three kerf regions 103. In one embodiment, the deep alignment marks 140 are preferably formed in eight or more kerf regions 103.

The novel deep alignment marks 140 may be used to provide access to the first alignment marks 114 within the metallization layer M1, for alignment of the lithography process used to pattern opaque material layers, which will be described further herein.

Figure 7:
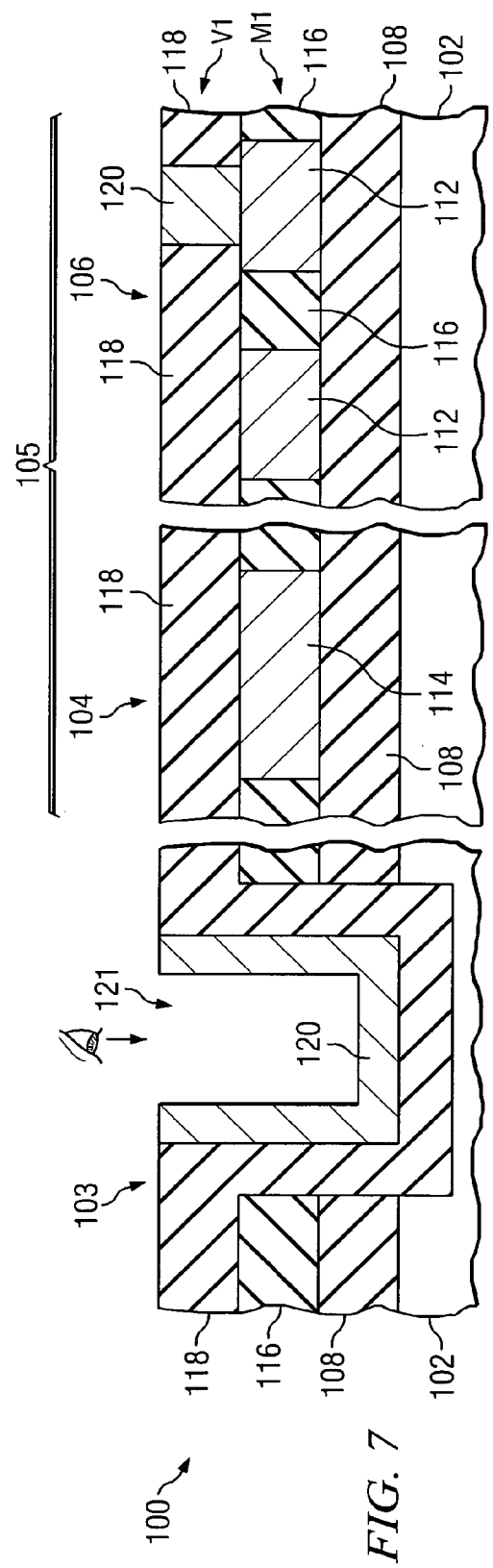

Next, referring to FIG. 5, an optional via layer V1 may be formed over the metallization layer M1 and the deep alignment mark 140. Preferably, if the semiconductor device 100 comprises an MRAM, as in the embodiment shown, the via layer V1 is used for electrical connection to a first conductive line 112, as shown in FIG. 7. However, in some semiconductor device 100 applications, a via layer V1 is not required, for example.

Referring again to FIG. 5, a second insulating layer 118 is deposited over the first insulating layer 116, the first conductive lines 112, and the first alignment marks 114. The second insulating layer 118 may comprise silicon nitride or other insulators such as silicon dioxide or low-k materials, as examples. The second insulating layer 118 may comprise an inter-level dielectric (ILD) for a via metallization layer (e.g., V1 or other via level) in which vias 120 are formed to make contact to underlying first conductive lines 112 in the array region 106, as shown. The second insulating layer 118 may comprise a thickness of a few thousand Angstroms, e.g., 3,000 Angstroms or less, as examples, although alternatively, the second insulating layer 118 may comprise other thicknesses. In one embodiment, the second insulating layer 118 preferably comprises a thickness of about 1,500 Angstroms or less, for example.

Conductive vias 120 may be formed within the second insulating layer 118 in the array region 106 using a damascene process, for example. The second insulating layer 118 is patterned with holes or trenches 152 (shown in phantom) for the vias 120, using a mask 150. The second insulating layer 118 is etched using the mask 150 as a mask, for example. The mask 150 is removed, and the vias 120 are filled with a conductive material 120 such as copper or tungsten, as examples, although the vias 120 may alternatively comprise other conductive materials, as shown in FIG. 6. The vias 120 may include a liner, not shown. Because the deep alignment mark 140 is deep, e.g., deeper than the combined thicknesses of the second insulating layer 118 and the conductive material 120, a depression 121 is visible from a top surface of the workpiece in the via conductive material 120 over the deep alignment mark 140, as shown.

A CMP process may be used to remove excess conductive material from over the top surface of the second insulating layer 118 to form the vias 120, leaving the structure shown in FIG. 7. Thus, again, the top surface of the second insulating layer 118 and vias 120 is substantially planar, except for the depression 121 formed in the via conductive material 120 over the deep alignment mark 140. Because a topography (e.g., depression 121) exists on the top surface of the second insulating layer 118 at this stage, this topography may be used for alignment of an opaque material layer 124, to be described next.

Figure 8:
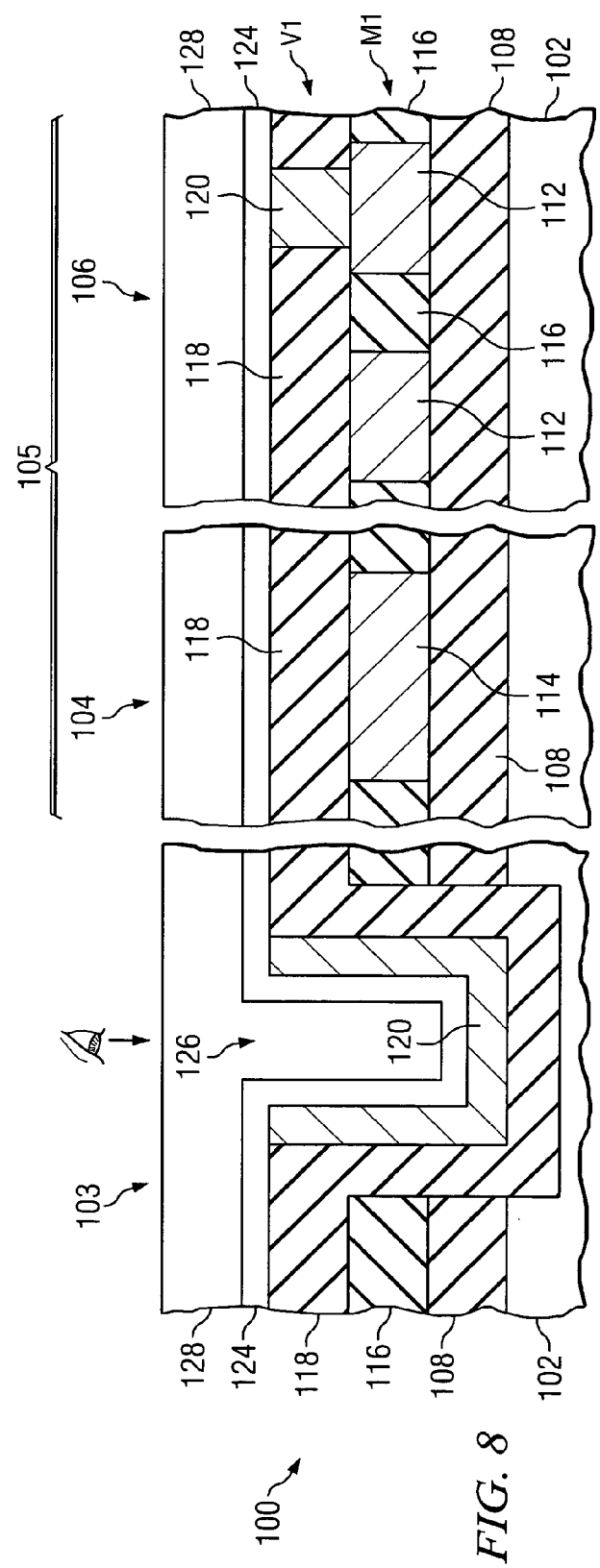

An opaque material layer 124 is deposited over the second insulating layer 118, the conductive vias 120, and over the depression 121 in the via conductive material 120 over the at least one deep alignment mark 140, as shown in a cross-sectional view in FIG. 8. The opaque material layer 124 may comprise a magnetic stack, for example, that is used to form MTJ's of an MRAM device 105. The opaque material layer 124 substantially conforms to the depressions in the via conductive material 120 (e.g., to the topography of the deep alignment marks 140), forming visually and/or optically detectable depressions 126 in the opaque material layer 124, as shown. The opaque material layer 124 may comprise a first magnetic layer, a tunnel barrier disposed over the first magnetic layer, and a second magnetic layer disposed over the tunnel barrier, wherein the second magnetic layer comprises an opaque material, for example. In other semiconductor device applications, the opaque material layer 124 may comprise other opaque materials.

A first masking layer 128 may be deposited over the opaque material layer 124, as shown in FIG. 8. The first masking layer 128 preferably comprises a translucent or transparent material so that the depressions 126 in the opaque material layer 124 are optically visible by the lithography tools used to pattern the first masking layer 128. The first masking layer 128 may comprise a photoresist, a hard mask and a photoresist, or other material and a photoresist, as examples, although alternatively, the first masking layer 128 may comprise other materials. If the first masking layer 128 comprises a hard mask material, the hard mask may comprise a dielectric material such as an oxide or nitride, as examples. As an example, the first masking layer 128 may comprise one or more hard mask material layers covered by a layer of photoresist. The photoresist may be used to pattern the hard mask, and the hard mask and optionally, also the photoresist may then be used to open the opaque material layer 124 in the alignment mark region 104.

Figure 9:
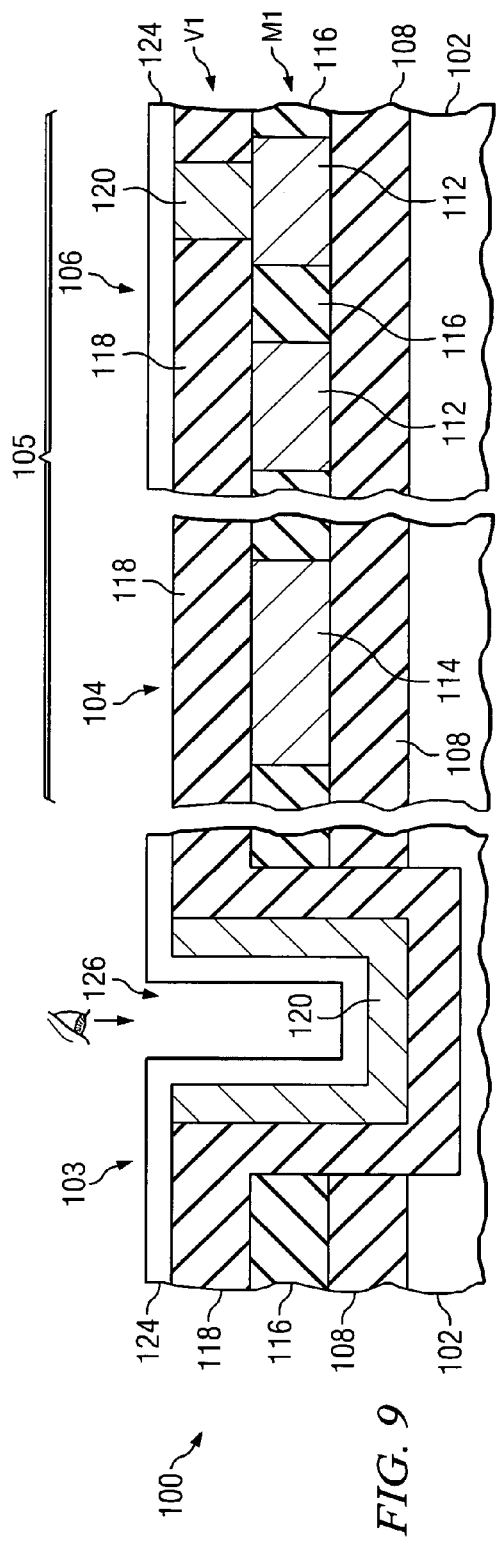

The first masking layer 128 is patterned (e.g., using a lithography mask or direct patterning method) to remove the first masking layer 128 in at least the region over the at least one first alignment mark 114 in the metallization layer M1, as shown in FIG. 9. The region opened in the first masking layer 128 may comprise a window that is slightly larger than the first alignment mark 114 pattern, for example. Alternatively, larger portions of the alignment mark region 104 may be opened, for example.

Advantageously, the depression 126 in the opaque material layer 124 is used to align the lithography mask or tool used to pattern the first masking layer 128 over the opaque material layer 124. The first masking layer 128 is then used as a mask while exposed portions of the opaque material layer 124 over at least the first alignment mark 114 are removed, as shown in FIG. 9. The first masking layer 128 is then removed, leaving the opaque material layer 124 remaining in the array region 106 and at least partially etched away in the alignment mark region 104.

Figure 10:
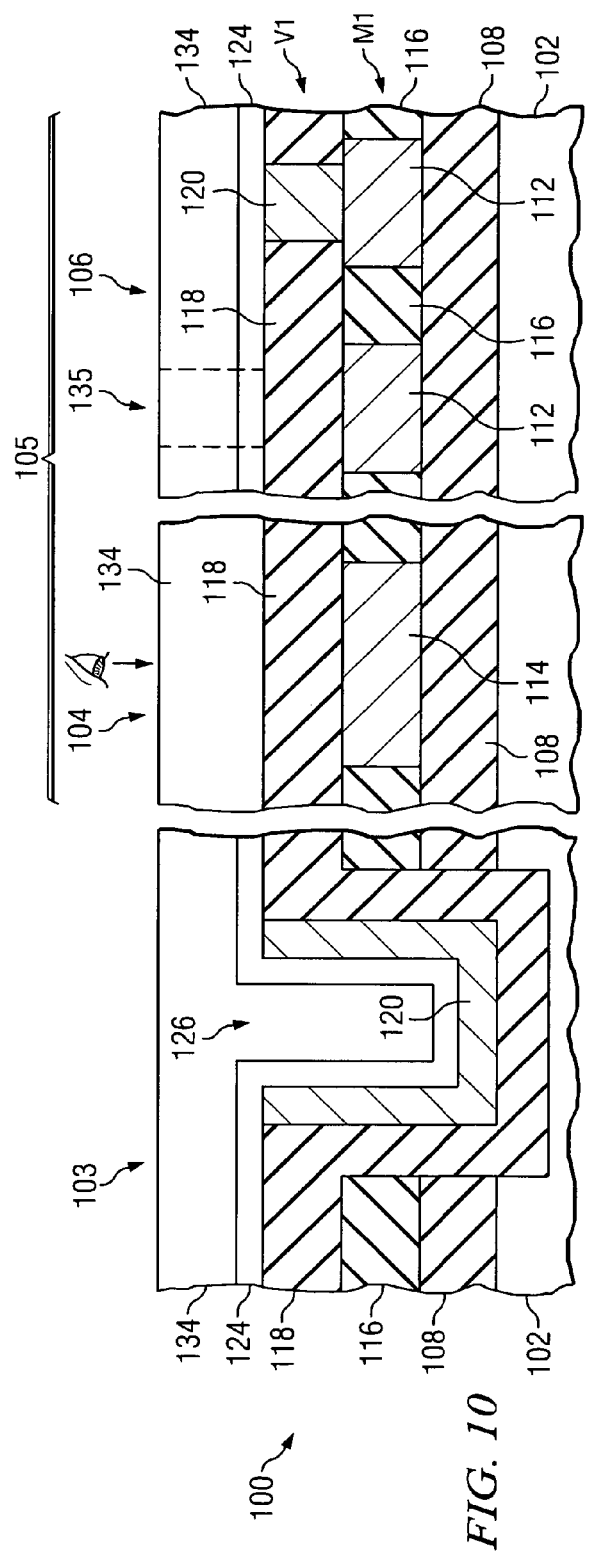

A second masking layer 134 is then deposited over the opaque material layer 124 and the at least one first alignment mark 114, as shown in FIG. 10. The second masking layer 134 preferably comprises a translucent or transparent material so that the at least one first alignment mark 114 in the M1 layer is optically visible by the lithography tools used to pattern the second masking layer 134. The second masking layer 134 may comprise a photoresist, a hard mask and a photoresist, or another material and a photoresist, as examples, although alternatively, the second masking layer 134 may comprise other materials. If the second masking layer 134 comprises a hard mask material, the hard mask may comprise a dielectric material such as an oxide or nitride, as examples. The second masking layer 134 may comprise one or more hard mask material layers covered by a layer of photoresist. For example, the photoresist may be used to pattern the hard mask, and the hard mask and optionally, also the photoresist may then be used to pattern the opaque material layer 124.

The second masking layer 134 is then patterned with the desired pattern 135 (shown in phantom in FIG. 10) for the opaque material layer 124 (e.g., using a lithography mask or direct patterning method), using the first alignment mark 114 of the first metallization layer M1 for alignment. The first alignment mark 114 is optically visible through the transparent/translucent via level ILD 118. For example, if the opaque material layer 124 comprises a magnetic stack, the second masking layer 134 is patterned with the desired pattern 135 of the MTJ's, with each MTJ being disposed over a conductive line 112 formed within the first insulating layer 116. The second masking layer 134 is then used as a mask while the opaque material layer 124 is patterned, leaving the opaque material layer 124 remaining in desired portions of the array region 106. The second masking layer 134 then removed, leaving the structure shown in FIG. 11.

Figure 12:
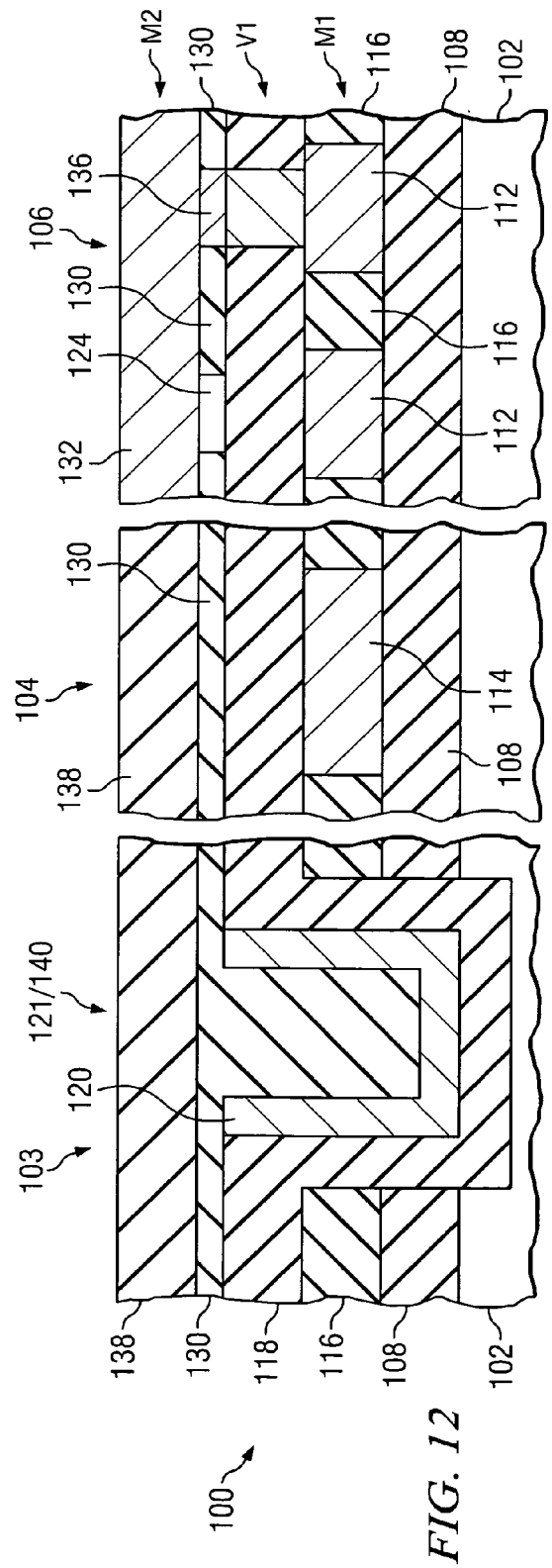

The manufacturing process for the semiconductor device 105 is then continued, as shown in FIG. 12. For example, a fourth insulating layer 130 comprising similar materials as described for the first insulating layer 116, the optional second insulating layer 118, and the optional at least one third insulating layer 108 may be formed between the MTJ's 124 or patterned opaque material, as shown. Additional materials 132 and 138 may be formed over the MTJ's 124 and the fourth insulating layer 130, also shown. For example, second conductive lines 132 positioned in a different direction than the first conductive lines 112 e.g., in a second metallization layer M2, may be formed in a fifth insulating layer 138 comprising similar materials as described for the other insulating layers 116, 118, 108, and 130, to form an MRAM array. The second conductive lines 132 may comprise similar materials and dimensions as described for the first conductive lines 112, for example.

The MRAM array may comprise a cross-point array, or a field effect transistor (FET) array, as examples. A conductive strap may be formed electrically coupling the bottom of the MTJ's 126 to an underlying first conductive line 112, not shown. A conductive via 136 may be formed between conductive via 120 and second conductive line 132, to make electrical contact to the workpiece 102, as shown in FIG. 12.

Advantageously, the novel processing scheme described herein provides an integration scheme for forming deep alignment marks 140 in at least a first insulating layer 116 of a kerf region 103 of a workpiece 102. The deep alignment marks 140 may be used for alignment when opening the opaque material layer 124 over the first alignment marks 114 in the alignment mark region 104 of the die region 105, so that the first alignment marks 114 may be used for the patterning of the opaque material layer 124 in the array region 106. This is particularly advantageous in applications where alignment to underlying structures is important in the manufacturing process, such as in the manufacturing process of an MRAM device 105, where the alignment of an MTJ 124 to a first conductive line 112 is critical, for example. Because the deep alignment marks 140 formed in the kerf region 103 are not exposed to a CMP process and because they extend deep into one or more insulating layers 116 (and optionally, layer 108), and even further into the workpiece 102 in one embodiment, the depressions 126 (see FIG. 8) in the opaque material layer 124 are clearly optically visible by lithography tools from the top surface of the workpiece 102 through the first masking layer 128. Thus, the depressions 126 may be used for alignment when opening the area over alignment marks 114. Therefore, excellent alignment of the MTJ's 124 to underlying first conductive lines 112 by using alignment marks 114 is achieved in accordance with embodiments of the present invention.

Figure 11:
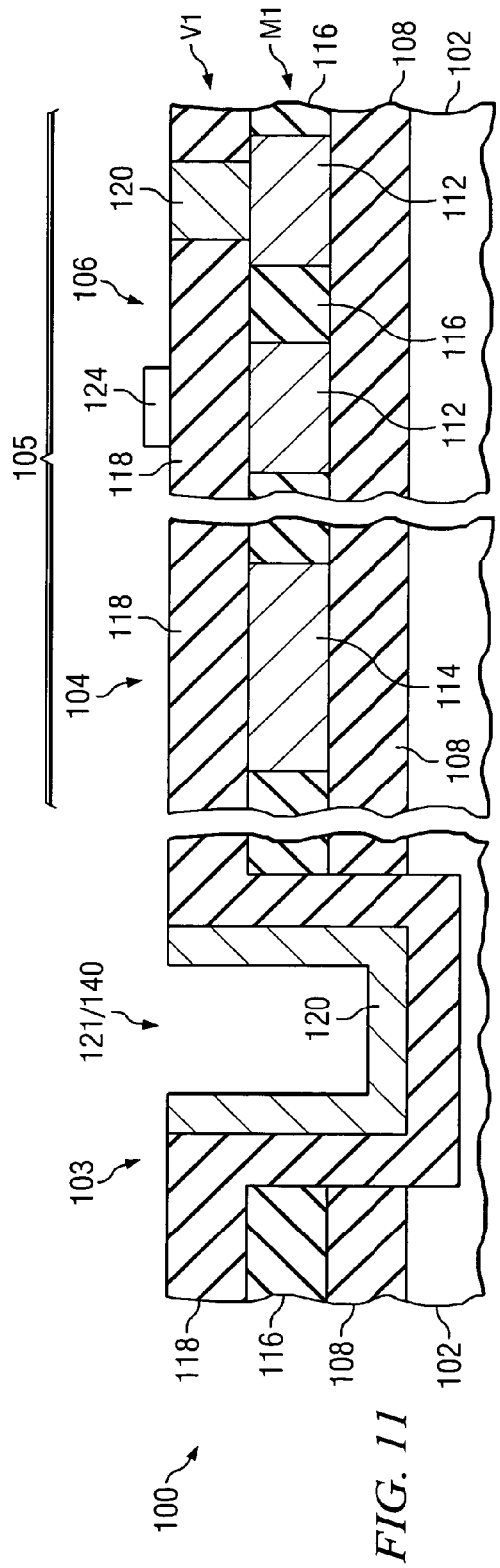

Another advantage of the novel deep alignment marks 140 of the present invention is that the at least one deep alignment mark 140 may be used to pattern two or more opaque material layers such as opaque material layer 124 shown in the figures and described herein. For example, an MTJ comprising two or more magnetic stack layers may be formed in accordance with embodiments of the present invention. After the opaque material layer 124 is patterned in the array region 106, as shown in FIG. 11, an additional opaque material layer (not shown) may be deposited over the patterned MTJ 124 or other structure comprising the opaque material layer 124, and also over the top surface of the second insulating layer 118 and the top surface of the conductive via 120 in the via layer V1 (or over the first insulating layer 116, if a second insulating layer 118 is not used). A third masking layer may be deposited over the additional opaque material layer, and the third masking layer may be patterned using depressions formed in the additional opaque material layer over the deep alignment marks 140 for alignment. The third masking layer is then used as a mask while the additional opaque material layer is removed from over the first alignment marks 114 in the metallization layer M1. (The manufacturing process using the first masking layer 128 to open opaque material layer 124 shown in FIGS. 8 and 9 is repeated for the additional opaque material layer). Likewise, a fourth masking layer is then deposited over the structure 100, and the fourth masking layer is patterned, using the first alignment marks 114 in the metallization layer M1 for alignment. The fourth masking layer is then used to pattern the additional opaque material layer, forming a second MTJ over the first MTJ 124 shown in FIG. 11. (The manufacturing process using the second masking layer 134 to pattern opaque material layer 124 shown in FIGS. 10 and 11 is repeated for the additional opaque material layer).

One or more additional opaque material layers may be deposited and patterned using this two-step process, aligning the first mask to depressions formed in the additional opaque material layers over the deep alignment marks 140 while removing the opaque material from over the first alignment marks 114, and then aligning the second mask to the first alignment marks 114 themselves. An MRAM device having two or more magnetic stacks disposed on top of one another may be manufactured in accordance with this embodiment of the invention. Embodiments of the present invention include processing schemes for patterning opaque material layers 124 using deep alignment marks 140, as described in detail herein.

In one embodiment, the via conductive material 120 may be removed from the deep alignment marks 140. The depressions 115 (see FIG. 5) formed in the second insulating layer 118 provide a topography and may be used for alignment of the first masking layer 128 (see FIG. 8) used to open the alignment mark region 104 in this embodiment. In yet another embodiment, the second insulating layer 118 may be removed from the deep alignment marks 140. An opaque material 124 disposed directly over the deep alignment marks 140 conforms to the sidewalls and bottom of the deep alignment mark trenches, again forming a depression (not shown) in the topography of the opaque material layer 124 that can be used for alignment.

Another embodiment of the present invention includes a novel semiconductor device structure. The structure includes a semiconductor workpiece 102, the workpiece 102 including a plurality of die regions 105 and at least one kerf region 103, the at least one kerf region 103 comprising regions where die is not formed or where incomplete die is formed. The workpiece 102 includes at least one material layer 116/118 disposed thereon. The workpiece 102 includes a first set 141*a*/141*b* of alignment marks 140 in a first kerf region 103, and a second set 141*a*/141*b* of alignment marks in a second kerf region 103 (see FIGS. 4A and 4C), wherein the first set of alignment marks and the second set of alignment marks extend at least about 8,000 Angstroms into the at least one material layer 116/118 disposed on the workpiece.

In one embodiment, the deep alignment marks 140 may be formed in one or more die regions 105 of the workpiece rather than or in addition to forming deep alignment marks 140 in the kerf region 103. In this embodiment, the die region 105 that the deep alignment marks 140 are formed in comprises a non-functioning chip. For example, the deep alignment marks 140 may be formed in the alignment mark region 104 or the component region 106, or both, of one or more die regions 105. The die regions 105 of the workpiece having the deep alignment marks 140 may be discarded after singulation, for example.

Advantages of embodiments of the invention include providing improved alignment of opaque material layers 124 to underlying components such as conductive lines 112. The deep alignment marks 140 are formed using a separate lithography mask than the mask used to pattern conductive vias 120 within the second insulating layer 118, for example. The deep alignment marks 140 preferably have a greater length than the vias 120 formed in the via layer V1 in one embodiment, and preferably extend deep into a plurality of material layers, and even into the workpiece 102 in some embodiments. Even though the deep alignment marks 140 are exposed to a CMP process in one embodiment (e.g., to form damascene vias 120), because the deep alignment marks 140 are formed so deeply within material layers 118, 116 and 108, and optionally the workpiece 102, the topography of the alignment marks 140 remains intact and is sharp and clear, so that the deep alignment marks 140 may be used to open the subsequently deposited opaque material layer over alignment marks 114, thus allowing the patterning of the opaque material layer 124 using the alignment marks 114 for alignment. Because the depressions 121 and 126 formed on material layers 118 and 124 comprise a clear pattern in the kerf region 104, the window size of the mask 128 used to open the first alignment marks 114 may be made smaller, saving surface area. Furthermore, because the novel deep alignment marks 140 are formed in the kerf region 103 of the workpiece 102, space on the workpiece 102 that was previously unused is now used, freeing up space in the alignment mark region 104 of the die region 105.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of manufacturing a semiconductor device, comprising:
    providing a workpiece, the workpiece including a plurality of die regions and a kerf region, each die region including an alignment mark region and a component region;
    forming a first insulating layer over the workpiece;
    forming at least one first alignment mark over the alignment mark region of each die region and a plurality of first conductive lines over the component region of each die region within the first insulating layer, wherein forming the at least one first alignment mark comprises filling the at least one first alignment mark with a conductive material;
    forming at least one second alignment mark within at least the first insulating layer over the kerf region of the workpiece, the at least one second alignment mark comprising a trench having a bottom and sidewalls;
    depositing an opaque material layer over the at least one second alignment mark and the first insulating layer, the opaque material layer lining the bottom and sidewalls of the trench of the at least one second alignment mark, leaving a depression in the opaque material layer over each at least one second alignment mark;
    depositing a first masking layer over the opaque material layer;
    patterning the first masking layer using a lithography mask or tool, removing the first masking layer from over the at least one first alignment mark, using the depression over the at least one second alignment mark to align the lithography mask or tool used to pattern the first masking layer over the opaque material layer;
    removing the opaque material layer from over the at least one first alignment mark using the first masking layer as a mask;
    removing the first masking layer;
    depositing a second masking layer over the opaque material layer and the at least one first alignment mark;
    patterning the second masking layer with a pattern for the opaque material layer in the component region of each die region using the at least one first alignment mark for alignment; and
    patterning the opaque material layer using the second masking layer as a mask.

2. The method according to claim 1, wherein the first masking layer or the second masking layer comprise a photoresist, or a hard mask and a photoresist.

3. The method according to claim 1, further comprising, after forming the at least one second alignment mark:
    forming a second insulating layer over the at least one second alignment mark, the at least one first alignment mark, the plurality of first conductive lines, and the first insulating layer;
    patterning the second insulating layer with a via pattern;
    depositing a conductive material layer over the patterned second insulating layer; and
    removing the conductive material layer from over a top surface of the second insulating layer, leaving a conductive via formed in the second insulating layer over the component region of each die region and leaving the conductive material layer lining the second insulating layer within the at least one second alignment mark, wherein depositing the opaque material layer comprises depositing the opaque material layer over the conductive material over each at least one second alignment mark.

4. The method according to claim 1, wherein forming the at least one second alignment mark comprises forming at least one set of second alignment marks.

5. The method according to claim 4, wherein the kerf region of the workpiece comprises a plurality of incomplete die or a plurality of unused workpiece areas, wherein forming the at least one second alignment mark comprises forming at least one set of alignment marks in at least two incomplete die or unused workpiece areas in the kerf region.

6. The method according to claim 5, wherein forming the at least one set of second alignment marks comprises forming a first set of second alignment marks along a top edge or a bottom edge of the incomplete die or unused workpiece areas in the kerf region, and forming a second set of second alignment marks along a vertical side edge of the incomplete die or unused workpiece areas in the kerf region.

7. The method according to claim 6, wherein forming the second alignment marks comprises forming second alignment marks having a width of about 2 μm or less and a length of about 60 μm or less.

8. The method according to claim 6, wherein the first set of second alignment marks comprises about 10 or more second alignment marks, and wherein the second set of alignment marks comprises about 10 or more second alignment marks.

9. The method according to claim 1, wherein forming the at least one second alignment mark within at least the second insulating layer comprises forming the at least one second alignment mark in at least the entire thickness of the first insulating layer.

10. The method according to claim 1, further comprising forming at least one third insulating layer over the workpiece, before forming the first insulating layer, wherein forming the at least one second alignment mark further comprises forming the at least one second alignment mark within at least a portion of the at least one third insulating layer.

11. The method according to claim 10, wherein forming the at least one second alignment mark comprises forming the at least one second alignment mark within the entire thickness of one of the at least one third insulating layer.

12. The method according to claim 11, wherein forming the at least one second alignment mark further comprises forming the at least one second alignment mark within the entire thickness of each at least one third insulating layer.

13. The method according to claim 12, wherein forming the at least one second alignment mark further comprises forming the at least one second alignment mark within a top portion of the workpiece.

14. The method according to claim 1, wherein forming the at least one second alignment mark comprises forming the at least one second alignment mark having a depth of at least about 8,000 Angstroms.

15. The method according to claim 1, wherein forming the at least one second alignment mark comprises forming the at least one second alignment mark having a depth of about 3 μm or less.

16. The method according to claim 1, wherein the semiconductor device comprises a magnetic random access memory (MRAM) device, wherein the alignment mark region comprises a kerf or edge region of each die region of the MRAM device, wherein the component region comprises an array region of the MRAM device, wherein the depositing the opaque material layer comprises depositing a first magnetic stack, and wherein patterning the opaque material layer comprises forming at least one magnetic tunnel junction (MTJ).

17. The method according to claim 16, further comprising, after forming the at least one second alignment mark:
   forming a second insulating layer over the at least one second alignment mark, the at least one first alignment mark, the plurality of first conductive lines, and the first insulating layer;
   patterning the second insulating layer with a via pattern;
   depositing a conductive material layer over the patterned second insulating layer; and
   removing the conductive material layer from over a top surface of the second insulating layer, leaving a conductive via formed in the second insulating layer over the component region of each die region and leaving the conductive material layer lining the second insulating layer within the at least one second alignment mark, wherein depositing the opaque material layer comprises depositing the opaque material layer over the conductive material over each at least one second alignment mark.

18. The method according to claim 16, further comprising:
   depositing a second magnetic stack over at least the MTJ, the second magnetic stack comprising an opaque material;
   depositing a third masking layer over the second magnetic stack;
   patterning the third masking layer using a lithography mask or tool, using the depression over the at least one second alignment mark to align the lithography mask or tool used to pattern the second masking layer over the second magnetic stack;
   removing the second magnetic stack from over the at least one first alignment mark using the third masking layer as a mask;
   removing the third masking layer;
   depositing a fourth masking layer over the second magnetic stack and the at least one first alignment mark;
   patterning the fourth masking layer with a pattern for the second magnetic stack using the at least one first alignment mark for alignment; and
   patterning the second magnetic stack using the fourth masking layer as a mask.

19. The method according to claim 16, wherein the first magnetic stack comprises a first magnetic layer, a tunnel baffler disposed over the first magnetic layer, and a second magnetic layer disposed over the tunnel barrier, wherein at least the second magnetic layer comprises an opaque material, further comprising forming a plurality of second conductive lines over each at least one MTJ.

20. The method according to claim 1, further comprising forming at least one second alignment mark within at least the first insulating layer over at least one of the plurality of die region of the workpiece, wherein a die region having the at least one second alignment mark formed therein comprises a non-functioning chip.

21. A method of manufacturing a magnetic memory device, comprising:
   providing a workpiece, the workpiece including a plurality of die regions and a kerf region, each die region comprising an alignment mark region at the edges thereof, and an array region disposed within the alignment mark region;
   forming a first insulating layer over the workpiece;
   forming at least one first alignment mark over the alignment mark region of each die region and a plurality of first conductive lines over the array region of each die region within the first insulating layer, wherein forming the at least one first alignment mark comprises filling the at least one first alignment mark with a conductive material;
   forming at least one second alignment mark within at least the first insulating layer over the kerf region of the workpiece, the at least one second alignment mark comprising a trench having a bottom and sidewalls;
   forming a second insulating layer over the at least one second alignment mark, the at least one first alignment mark, the plurality of first conductive lines, and the first insulating layer, wherein the second insulating layer lines the bottom and sidewalls of the at least one second alignment mark trench;
   forming a conductive via in the second insulating layer over the array region of each die region using a damascene process, wherein the conductive via material lines the second insulating layer lining the at least one second alignment mark bottom and sidewalls;

depositing a first magnetic stack over the conductive via and the second insulating layer, wherein a depression is formed in the first magnetic stack over each at least one second alignment mark;

depositing a first masking layer over the first magnetic stack;

patterning the first masking layer using a lithography mask or tool, removing the first masking layer from over the at least one first alignment mark, using the depression in the first magnetic stack over the at least one second alignment mark to align the lithography mask or tool used to pattern the first masking layer over the first magnetic stack;

removing the first magnetic stack from over the at least one first alignment mark using the first masking layer as a mask, leaving the at least one first alignment mark exposed;

removing the first masking layer;

depositing a second masking layer over the first magnetic stack and the at least one first alignment mark;

patterning the second masking layer with a pattern for the first magnetic stack in the array region of each die region using the at least one first alignment mark for alignment; and patterning the first magnetic stack using the second masking layer as a mask, wherein the patterned first magnetic stack comprises a magnetic memory cell.

22. The method according to claim 21, wherein the kerf region comprises a plurality of incomplete die or a plurality of unused workpiece areas, wherein forming the at least one second alignment mark comprises forming at least one set of alignment marks in at least two incomplete die or unused workpiece areas in the kerf region.

23. The method according to claim 21, wherein forming the at least one set of second alignment marks comprises forming a first set of second alignment marks along a top edge or a bottom edge of the incomplete die or unused workpiece areas in the kerf region, and forming a second set of second alignment marks along a vertical side edge of the incomplete die or unused workpiece areas in the kerf region.

24. The method according to claim 23, wherein forming the second alignment marks comprise forming second alignment marks having a width of about 2 μm or less and a length of about 60 μm or less, and wherein the first set of second alignment marks comprises about 10 or more second alignment marks, and wherein the second set of alignment marks comprises about 10 or more second alignment marks.

25. The method according to claim 21, wherein forming the at least one second alignment mark within at least the first insulating layer comprises forming the at least one second alignment mark in at least the entire thickness of the first insulating layer, or forming the at least one second alignment mark within a top portion of the workpiece.

26. The method according to claim 25, wherein the workpiece further comprises at least one third insulating layer disposed between the workpiece and the first insulating layer, wherein forming the at least one second alignment mark comprises forming the at least one second alignment mark within at least a portion of at least one of the third insulating layers.

27. The method according to claim 21, wherein forming the at least one second alignment mark comprises forming the at least one second alignment mark having a depth of at least about 8,000 Angstroms.

28. The method according to claim 21, wherein forming the at least one second alignment mark comprises forming the at least one second alignment mark having a depth of about 3 μm or less.

29. The method according to claim 21, wherein the magnetic memory device comprises a magnetic random access memory (MRAM) device, and wherein patterning the magnetic stack comprises forming at least one magnetic tunnel junction (MTJ).

30. The method according to claim 29, further comprising:
depositing a second magnetic stack over at least the MTJ, the second magnetic stack comprising an opaque material;

depositing a third masking layer over the second magnetic stack;

patterning the third masking layer using a lithography mask or tool, using the depression over the at least one second alignment mark to align the lithography mask or tool used to pattern the second masking layer over the second magnetic stack;

removing the second magnetic stack from over the at least one first alignment mark using the third masking layer as a mask;

removing the third masking layer;

depositing a fourth masking layer over the second magnetic stack and the at least one first alignment mark;

patterning the fourth masking layer with a pattern for the second magnetic stack using the at least one first alignment mark for alignment; and patterning the second magnetic stack using the fourth masking layer as a mask.

31. The method according to claim 29, wherein the first magnetic stack comprises a first magnetic layer, a tunnel baffler disposed over the first magnetic layer, and a second magnetic layer disposed over the tunnel barrier, wherein at least the second magnetic layer comprises an opaque material, further comprising forming a plurality of second conductive lines over each at least one MTJ.

32. A method of forming alignment marks of a semiconductor workpiece, the method comprising:
providing a semiconductor workpiece, the workpiece including a plurality of die regions and at least one kerf region, the at least one kerf region comprising regions where no die is formed or where an incomplete die is formed, the workpiece including at least one material layer disposed thereon;

forming a first set of alignment marks in a first kerf region where no die is formed or where an incomplete die is formed;

forming a second set of alignment marks in a second kerf region where no die is formed or where an incomplete die is formed, wherein the first set of alignment marks and the second set of alignment marks extend at least about 8,000 Angstroms into the at least one material layer disposed on the workpiece, or into the at least one material layer and the workpiece and using the first and second set of alignment marks for alignment in order to expose alignment marks in an underlying layer of the workpiece.

* * * * *

UNITED STATES PATENT AND TRADEMARK OFFICE
CERTIFICATE OF CORRECTION

PATENT NO. : 7,442,624 B2
APPLICATION NO. : 10/909599
DATED : October 28, 2008
INVENTOR(S) : Sarma et al.

It is certified that error appears in the above-identified patent and that said Letters Patent is hereby corrected as shown below:

On the Title Page, Item (56) References Cited, U.S. PATENT DOCUMENTS, Page 2, 2$^{nd}$ Column, last entry, delete "Galdis" and insert --Gaidis--.
In Col. 18, line 29, delete "baffler" and insert --barrier--.
In Col. 20, line 38, delete "baffler" and insert --barrier--.
In Col. 20, line 60, after workpiece insert --;--.

Signed and Sealed this

Tenth Day of March, 2009

JOHN DOLL
*Acting Director of the United States Patent and Trademark Office*